United States Patent
Yamaoka et al.

(10) Patent No.: US 7,821,814 B2
(45) Date of Patent: *Oct. 26, 2010

(54) SEMICONDUCTOR MEMORY DEVICE

(75) Inventors: Masanao Yamaoka, Hachioji (JP); Kenichi Osada, Tokyo (JP); Kazumasa Yanagisawa, Kokubunji (JP)

(73) Assignee: Renensas Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/222,753

(22) Filed: Aug. 15, 2008

(65) Prior Publication Data

US 2008/0316800 A1    Dec. 25, 2008

Related U.S. Application Data

(63) Continuation of application No. 11/717,629, filed on Mar. 14, 2007, now Pat. No. 7,428,164, which is a continuation of application No. 10/733,270, filed on Dec. 12, 2003, now Pat. No. 7,200,030.

(30) Foreign Application Priority Data

Dec. 24, 2002    (JP)    .............................. 2002-371751

(51) Int. Cl.
    G11C 11/00    (2006.01)
    G11C 5/14    (2006.01)
(52) U.S. Cl. ........................ 365/154; 365/156; 365/226; 365/227; 365/228; 365/229
(58) Field of Classification Search .................. 365/154, 365/156, 226, 227, 228, 229
See application file for complete search history.

(56) References Cited

U.S. PATENT DOCUMENTS

| | | | |
|---|---|---|---|
| 4,764,897 | A | 8/1988 | Kameyama et al. |
| 5,132,929 | A | 7/1992 | Ochii |
| 5,689,471 | A | 11/1997 | Voss et al. |
| 5,841,720 | A | 11/1998 | Covino et al. |
| 5,986,924 | A | 11/1999 | Yamada |
| 6,373,760 | B1 | 4/2002 | Ohbayashi |
| 6,456,555 | B2 | 9/2002 | Sim et al. |
| 6,549,453 | B2 | 4/2003 | Wong |
| 6,556,058 | B2 | 4/2003 | Ohbayashi |
| 6,556,472 | B2 | 4/2003 | Yokozeki |
| 6,574,161 | B2 | 6/2003 | Ooishi |
| 6,611,451 | B1 | 8/2003 | Houston |
| 6,744,659 | B1 | 6/2004 | Eby et al. |
| 6,791,354 | B2 | 9/2004 | Mori et al. |

(Continued)

FOREIGN PATENT DOCUMENTS

JP    5-120882    5/1993

(Continued)

*Primary Examiner*—Trong Phan
(74) *Attorney, Agent, or Firm*—Mattingly & Malur, P.C.

(57)    ABSTRACT

When threshold voltages of constituent transistors are reduced in order to operate an SRAM circuit at a low voltage, there is a problem in that a leakage current of the transistors is increased and, as a result, electric power consumption when the SRAM circuit is not operated while storing data is increased. Therefore, there is provided a technique for reducing the leakage current of MOS transistors in SRAM memory cells MC by controlling a potential of a source line ssl of the driver MOS transistors in the memory cells.

5 Claims, 15 Drawing Sheets

U.S. PATENT DOCUMENTS

| | | | |
|---|---|---|---|
| 6,795,332 B2 * | 9/2004 | Yamaoka et al. | 365/154 |
| 6,826,074 B2 | 11/2004 | Yamauchi | |
| 6,829,183 B2 | 12/2004 | Braceras | |
| 6,950,362 B2 | 9/2005 | Kurumada et al. | |

FOREIGN PATENT DOCUMENTS

| | | |
|---|---|---|
| JP | 7-296587 | 11/1995 |
| JP | 2002-197867 | 7/2002 |

* cited by examiner

*FIG. 6A*  *FIG. 6B*
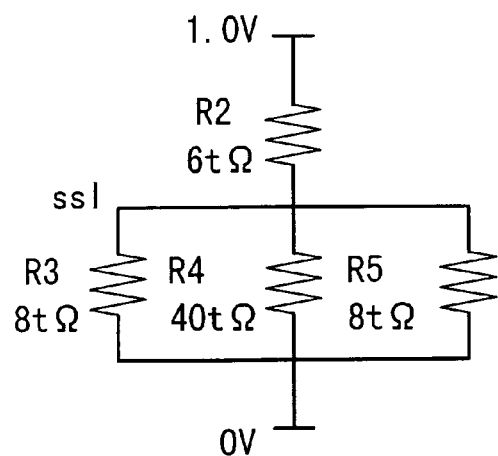
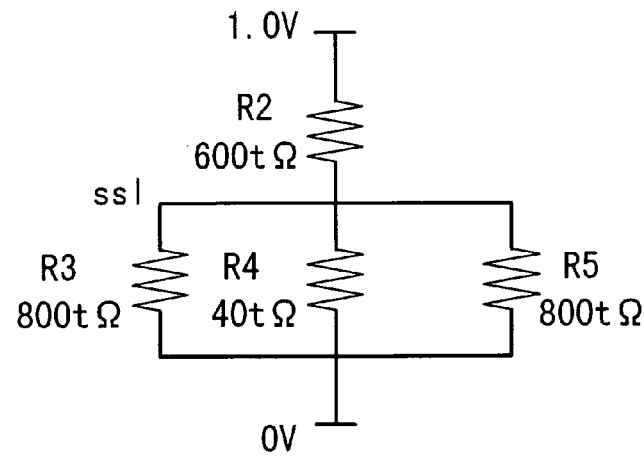
*FIG. 7*
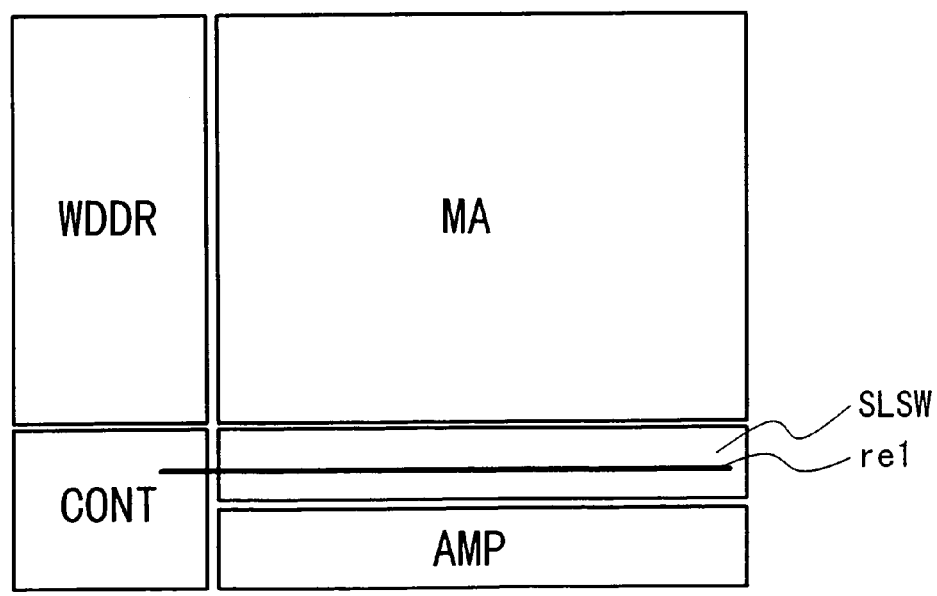

|  | MT1, MT2 | MD1, MD2 | ML1, ML2 | lvt/hvt |
|---|---|---|---|---|
| CASE1 | 0.50 | 0.50 | 0.50 | 0.40/0.50 |
| CASE2 | 0.50 | 0.50 | 0.70 | 0.40/0.50 |
| CASE3 | 0.50 | 0.60 | 0.70 | 0.40/0.50 |
| CASE4 | 0.40 | 0.50 | 0.70 | 0.40/0.50 |

SEMICONDUCTOR MEMORY DEVICE

RELATED APPLICATIONS

This application is a continuation of U.S. patent application Ser. No. 11/717,629, filed Mar. 14, 2007, now U.S. Pat. No. 7,428,164, which is a continuation of U.S. patent application Ser. No. 10/733,270, filed Dec. 12, 2003, now U.S. Pat. No. 7,200,030, issued Apr. 3, 2007, which claims priority to JP 2002-371751, filed Dec. 24, 2002, the contents of which are hereby incorporated by reference into this application.

FIELD OF THE INVENTION

The present invention relates to a semiconductor integrated circuit in which static memory (SRAM) circuits are integrated on a semiconductor chip. More particularly, the present invention relates to a configuration for reducing a standby current in an SRAM integrated circuit device and a configuration for operating the SRAM integrated circuit device at a low supply voltage.

DESCRIPTION OF THE RELATED ART

Japanese Patent Laid-Open No. 7-296587 discloses a circuit for reducing a standby current by using a resistance to make a source line potential of a driver transistor in an SRAM memory cell higher than a ground potential. Japanese Patent Laid-Open No. 2002-197867 discloses a circuit for reducing the standby current by using a diode to make the source line potential of the driver transistor in the SRAM memory cell higher than the ground potential. Japanese Patent Laid-Open No. 5-120882 discloses a circuit for reducing a leakage current flowing through transfer MOS by applying a voltage lower than the ground potential to a word line of the memory cell that is not accessed in the SRAM circuit.

As an electric power consumption of an LSI (Large Scale Integrated Circuit) is reduced and transistors in the LSI become smaller more and more, a supply voltage of the LSI is also reduced. For example, in the case of 0.13 μm process, the LSI operating with supply voltage of 1.2 V is manufactured. If the supply voltage of the LSI is reduced, in order to prevent circuit performance (an operational speed of the circuit) from deteriorating, a threshold voltage (Vth) for the transistors is reduced so as to increase a current for the transistors and, for example, in the 0.13 μm process, MOS transistors with Vth of about 0.4 V are used. In transistors with low Vth, a current that flows between source and drain when the transistors are OFF and that is referred to as a subthreshold current is increased. This current flows continuously even when the circuit comprised of the related transistors is not operating and, therefore, it is consumed continuously even in the state in which the LSI is energized but not operating (hereinafter referred to as "the standby state"). In a logic circuit in which data is not saved, the leakage current can be inhibited by shutting off the power supply in the standby state but, in a memory circuit in which data must be saved even in the standby state, the power supply cannot be shut off even in the standby state. Thus, there is a problem in that the subthreshold current is increased and, therefore, the electric power consumption in the standby state is also increased as Vth of the transistors constituting the circuit is reduced.

It has conventionally been considered effective to reduce the leakage current by applying a back-gate bias to increase Vth of the MOS transistors but, when the back-gate bias is applied to the MOS transistors manufactured in a microfabrication process, a potential between drain and back-gate may be increased and, as a result, a leakage current called a junction leakage may be increased. When the junction leakage is increased, the leakage current may not be reduced even though the subthreshold leakage is reduced by increasing the Vth with the aid of the back-gate bias. In the SRAM circuit, by making the source line potential of the driver MOS in the memory cell higher than the ground potential, a substrate bias effect can be applied to the transfer MOS and the driver MOS so as to reduce the leakage current significantly. In this case, though the substrate bias is applied, the potential between drain and back-gate does not differ from the one when the substrate bias is not applied and, therefore, the junction leakage current is not increased.

However, considering the fact that a circuit for controlling the potential itself consumes an amount of current and, if the circuit for controlling the potential is designed so that it consumes less current, it may be very susceptible to manufacturing variations in transistors and so on, there is a problem in that the reduction of the leakage current may become less effective.

As the manufacturing process of the MOS transistors becomes finer, the variation of Vth in the transistors tends to be increased. In the SRAM circuit having a large variation of Vth, there is also a problem in that it is impossible to write to the memory cell if Vth of the transfer MOS is increased and Vth of the load MOS is reduced.

SUMMARY OF THE INVENTION

It is an object of the present invention to provide a circuit design that can reduce a leakage current in a SRAM circuit and operate the SRAM circuit at a high speed.

In the SRAM circuit, the leakage current can be reduced by controlling a source line potential. If a circuit for controlling the source line potential is comprised of three elements that are: a switch for fixing the source line potential to a ground potential; a MOS transistor connected as a diode for determining the potential; and a resistance for passing a current continuously, the source line potential in the memory cell can be controlled without consuming electric power in the control circuit.

Further, by using the three elements, the variations in the manufacturing process of the source line potential control circuit can be taken into account.

When data is written to the SRAM memory cell, the source line potential is set to be higher than the ground potential just as in the standby state. Because the gate voltage of the load MOS is higher than the ground potential, it increases conductance so that the data can be written normally even when Vth of the transfer MOS in the memory cell is increased and Vth of the load MOS is reduced.

BRIEF DESCRIPTION OF THE DRAWINGS

FIG. 6 is a diagram for additionally describing factors to determine the potential of the supply line ssl;

FIG. 7 is a diagram showing a layout of the power supply switch and its control signal in the SRAM circuit;

DESCRIPTION OF THE PREFERRED EMBODIMENTS

First Embodiment

Figure 1:
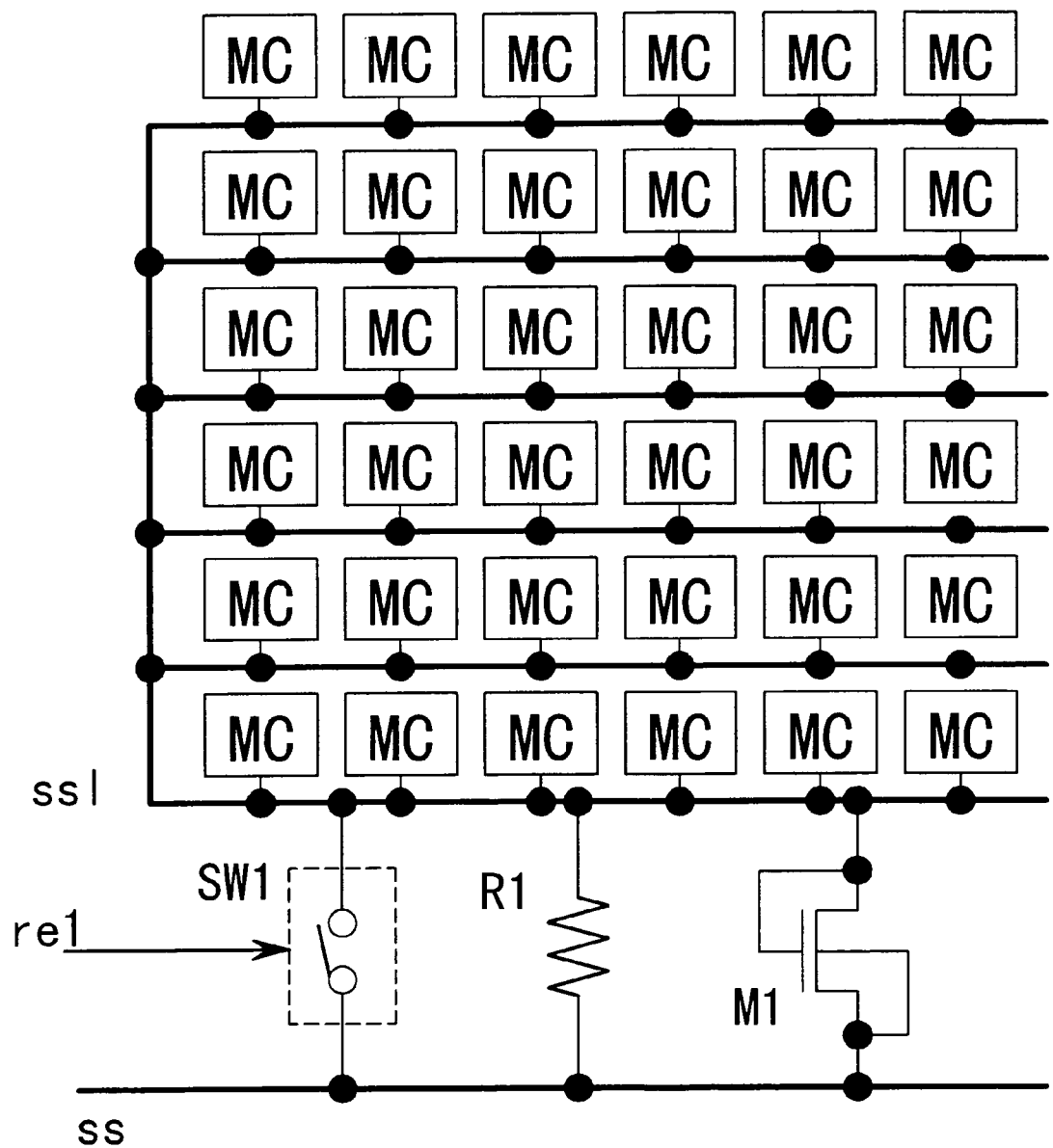
FIG. 1 is a schematic view of a circuit configuration and a power supply configuration of an SRAM circuit to which the present invention is applied.
Figure 2:
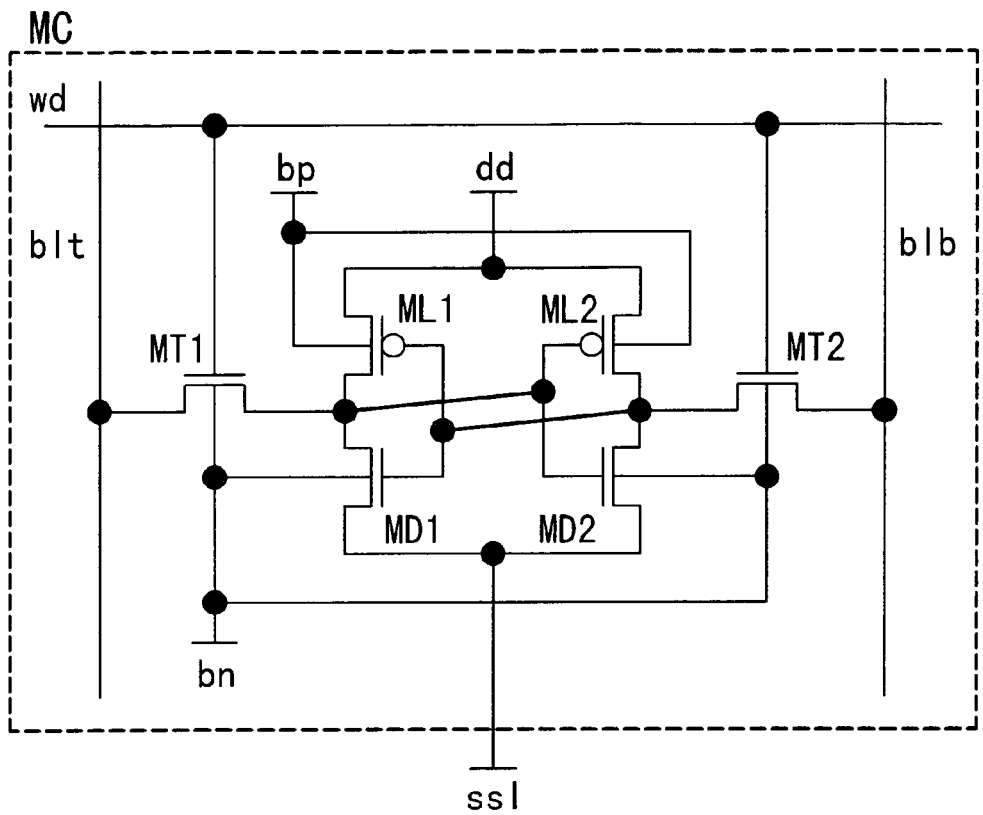
FIG. 2 is a schematic view of a circuit configuration and a power supply configuration of a memory cell in FIG. 1.

FIG. 1 schematically shows an SRAM circuit to which the present invention is applied. In FIG. 1, there are shown SRAM memory cells MC, a source line ssl for driver MOS in the memory cells, a ground potential line ss, a switch circuit SW1 that is turned ON or OFF by a control signal re1, a resistance R1, and a MOS transistor M1 connected as a diode between ssl and ss. FIG. 2 shows a configuration of the MC of FIG. 1. There are shown transfer MOS MT1 and MT2, driver MOS MD1 and MD2, load MOS ML1 and ML2, a word line wd, bit lines blt and blb, a source-potential line or a supply potential line dd for the load MOS in the memory cell, a line bp connected to a substrate terminal of the p-channel MOS in the memory cell, a line bn connected to a substrate terminal of the n-channel MOS in the memory cell, and a source potential line ssl of the driver MOS in the memory cell. In FIG. 1, if the switch SW1 is closed while the SRAM circuit is operating, the potential of ssl is set to the ground potential and the SRAM circuit operates similarly to ordinary SRAM. When the SRAM circuit is not operating and data is stored, the switch SW1 is opened by the control signal re1. At this time, the potential of ssl is determined by a relationship among a leakage current of the memory cells, a current flowing through the resistance R1 and a current of the MOS transistor M1 connected as a diode. Further, if the MOS or other elements constituting the memory cell has a leakage current even when the switch SW1 is turned OFF, in addition to the currents of the three elements mentioned above, the OFF current of the switch SW1 relates to the determination. Assuming that the potential of ssl is Vssl and the supply potential is Vdd, if the voltage value Vdd−Vssl is higher than the voltage at which the memory cell in the SRAM can retain the data, the data can be retained while reducing the leakage current.

Figure 3:
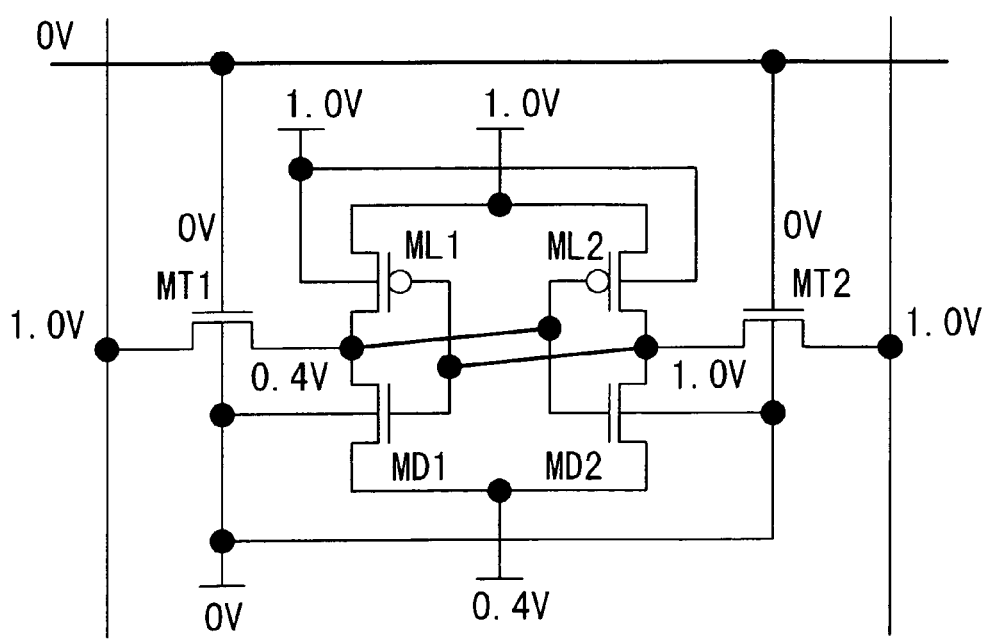
FIG. 3 is a diagram showing potentials at each part when the memory cell in FIG. 2 is in the standby state.

Here, in an example in which the potential Vssl of ssl is set to 0.4 V in the circuit having a supply voltage Vdd of 1.0 V, an effect of reducing the leakage current will be described using the circuit of FIG. 3. In the standby state, because the leakage current can be reduced by setting the bit line to the supply potential, the bit line potential is set to the supply potential also in the circuit of FIG. 3. Though not shown in the figure, it can be easily implemented by using a circuit for precharging the bit line. In FIG. 3, the potentials at each node in the standby state are added to the circuit of FIG. 2.

In FIG. 3, six MOS transistors are shown but, among them, MT2, MD1 and ML2 are in the ON state and, therefore, the leakage current does not need to be taken into account for them. In MT1 that acts as the transfer MOS, the source potential is 0.4 V, the gate potential is 0 V, the drain potential is 1.0 V and the back-gate potential is 0 V. In this condition, because a positive voltage is applied between source and back-gate, the substrate bias effect acts so as to reduce the subthreshold leakage current. Also, in this condition, because the voltage between gate and source takes a negative value, the subthreshold leakage can be further reduced. In the transistor manufactured in 0.13 μm process, by setting the potential of MT1 as described above, the leakage current can be reduced to about 1/10,000 in comparison with the case in which the source potential is 0 V. In MD2 that acts as the driver MOS, the source potential is 0.4 V, the gate potential is 0.4 V, the drain potential is 1.0 V and the back-gate potential is 0 V. In this state, the voltage between drain and source is 0.6 V and the substrate bias of 0.4 V is applied. In the transistor manufactured in 0.13 μm process, by setting the potential of MD2 as described above, the leakage current can be reduced to about 1/100 in comparison with the case in which the source potential is 0 V. In ML1 that acts as the load MOS, the source potential is 1.0 V, the gate potential is 1.0 V, the drain potential is 0.4 V and the back-gate potential is 1.0 V. In this state, the voltage between source and drain is 0.6 V and the transistor is in the OFF state. Therefore, the substrate bias effect is not applied and, therefore, by setting the potential of ML1 as described above, the subthreshold leakage current of nMOS transistors can be reduced proportionally to about 3/5 in comparison with the case in which the source potential is 0 V. As described above, by controlling the potential of the source line ssl, the subthreshold leakage current of the nMOS transistors in the memory cell can be reduced significantly. Though the example in which Vssl is 0.4 V has been described here, the higher this potential is, the larger the effect to reduce the leakage current is and, the lower this potential is, the smaller the effect to reduce the leakage current is. But, considering the fact that the data stored in the SRAM memory cell becomes more likely to be damaged as the potential of Vssl is increased, if the target value of the leakage current is determined, it is desirable that the Vssl is set to the minimum value that can satisfy the target value. Conversely, if the maximum Vssl with which the data can be stored in the memory cell is determined according to the manufacturing process of the transistors, the value of Vssl cannot exceed the determined maximum value.

Figure 4:
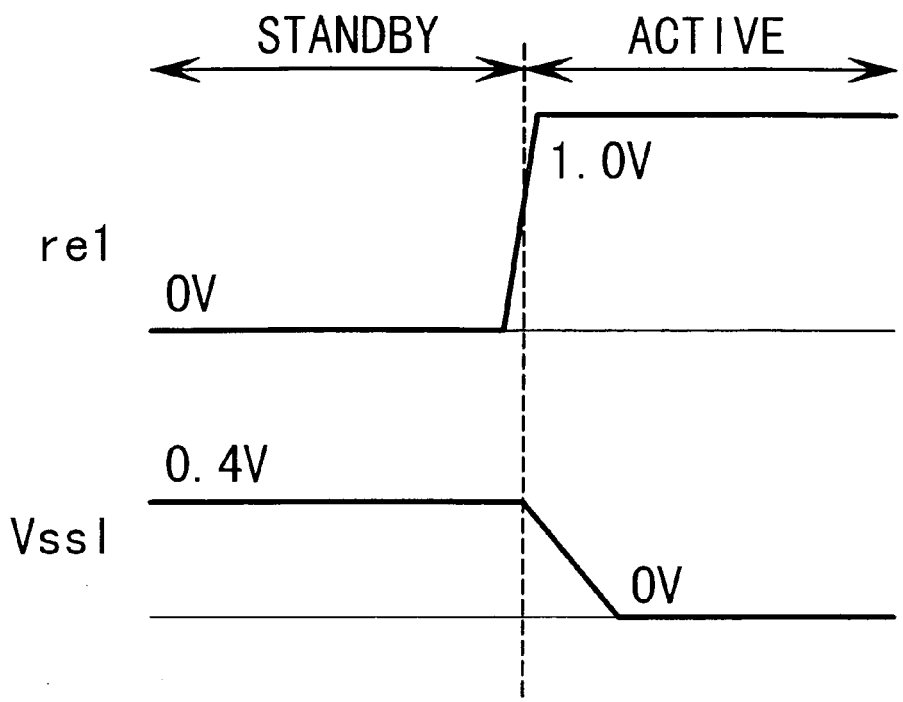
FIG. 4 is a diagram showing a relationship between a control signal and a potential of a supply line ssl in the SRAM circuit of FIG. 1.

FIG. 4 shows a relationship between the control signal re1 and the potential Vssl both in the standby state and in the operational state. In this figure, the standby state is designated as "standby", in which re1 is set to 0 V and Vssl is set to a value higher than the ground potential and lower than the supply potential. In FIG. 4, an example in which Vssl is set to 0.4 V is shown. The operational state is designated as "active", in which re1 is set to the supply potential and Vssl is set to the ground potential. In this configuration, Vssl is set to 0.4 V so as to reduce the leakage current in the standby state and Vssl is set to 0 V in the operational state so that the SRAM circuit can operate normally.

Then, with reference to FIG. 1, an optimal value of the potential Vssl of ssl will be described. Typically, LSI are designed in consideration of variations in transistor characteristics so that the required specifications can be satisfied even with the worst variations. In particular, the leakage current that represents a power consumption of the LSI in the standby state is greatly susceptible to the variations in transistor thresholds and, in the transistor microfabrication process, even in LSI having an identical circuit construction manufactured in an identical fabrication process, the value of the leakage current may differ by about 1,000 times between when Vth of the transistor takes the maximum value and when it takes the minimum value. Thus, if an LSI is designed so that the required performance as for the leakage current is obtained even in the condition in which the leakage current takes the maximum value or, in other words, even when the LSI is manufactured with the lowest Vth of the transistors, the LSI will be rather overdesigned so that, if the leakage current takes the minimum value or, in other words, if the LSI is manufactured with the highest Vth of the transistors, only a leakage current that is about 1/1,000 less than the required performance flows. Therefore, in order to design the LSI that can satisfy the requirement for the leakage current and in which the data retained in the memory cells is not likely to be damaged, the potential Vssl should be increased as much as possible when the leakage current takes the maximum value or Vth of the transistor is low and, on the other hand, the potential Vssl should be reduced as much as possible when the Vth of the transistor is high. In particular, when Vth of the transistors in the SRAM memory cell is high, the potential Vssl must be reduced so that the data in the memory cell is not likely to be damaged.

Figure 5:
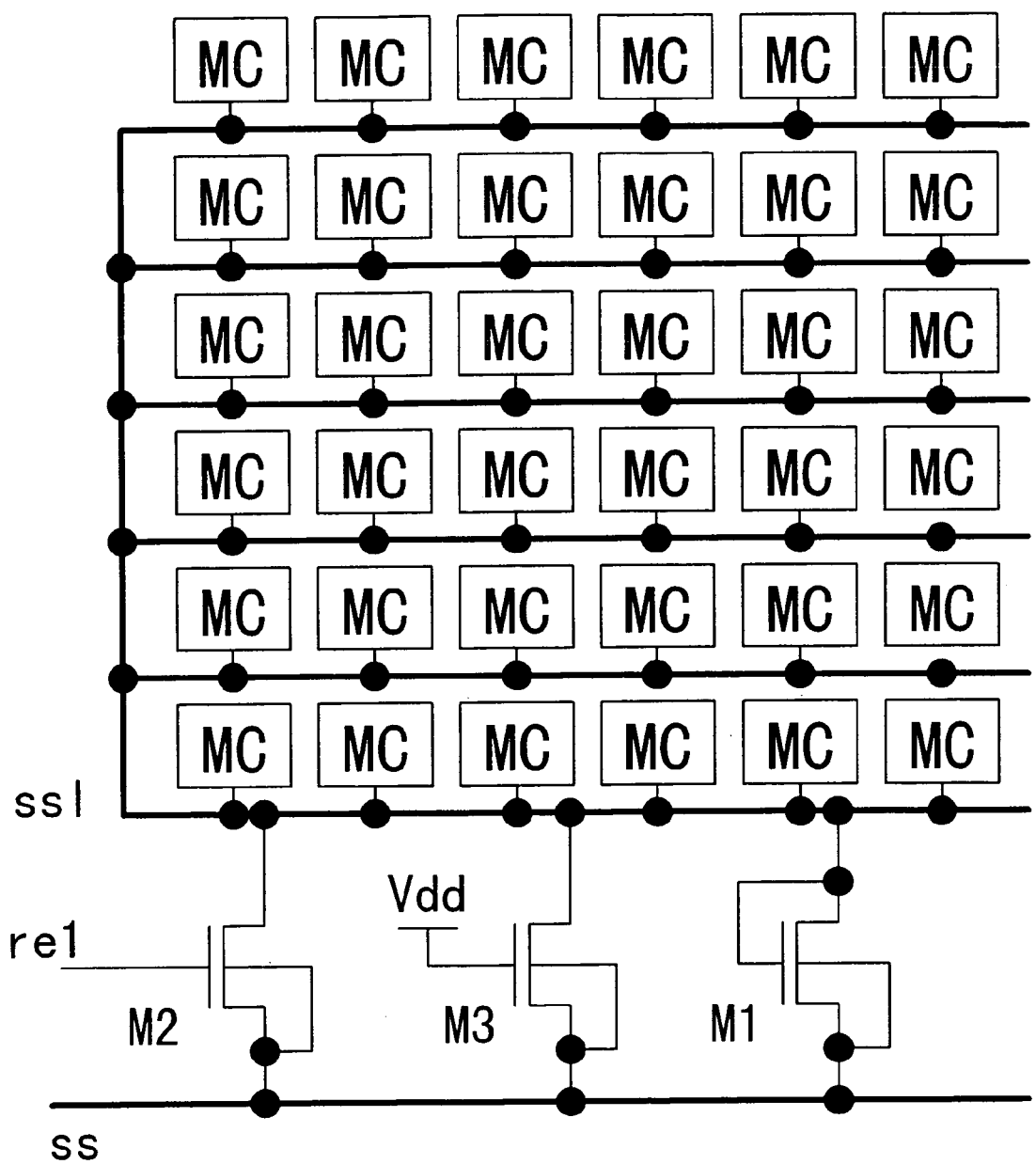
FIG. 5 is a circuit diagram in which the switch circuit SW1 and a resistance R1 in the SRAM circuit of FIG. 1 are constituted by MOS transistors.

When the circuit of FIG. 1 is fabricated on an LSI, it can be contemplated that the switch of FIG. 1 is made of a transistor M2 and the resistance of FIG. 1 is replaced by a transistor M3 that is always in the ON state as in the circuit shown in FIG. 5. In the circuit of FIG. 5, in the standby state, the value of Vssl is determined by leakage current values of the memory cells MC and current values of the transistors M1, M2 and M3. Here, because of the nature as the leakage current, the current of the memory cells fluctuates significantly as the threshold voltage varies. For example, if Vth varies by 100 mV, the value of the leakage current is changed more than 10 times. Also in the transistors M1 and M2, which are in the OFF state, current values are changed significantly depending on the fluctuation of Vth, just as the leakage current of the memory cells. In contrast, in the transistor M3, which is in the ON state, the current value varies little even when Vth fluctuates. For example, when Vth varies by 100 mV, the current is changed by about 20%. The operation of the circuit of FIG. 5 will be described with reference to FIGS. 6A and 6B. R2, R3, R4 and R5 represent a resistance value due to the leakage current of the memory cells, a resistance value due to the leakage current of the transistor M2, a resistance value due to the ON current of the transistor M3 and a resistance value due to the leakage current of the transistor M1, respectively, wherein the symbol "t" in each resistance value is a given constant. In the circuit of FIG. 5, when Vth of the transistors is low, each resistance values take values as shown in FIG. 6A and the potential Vssl of ssl is about 0.4 V. Then, FIG. 6B shows a state in which Vth of the transistors are increased and the leakage current value is reduced to about 1/100 of the one in the state of FIG. 6A. R2, R3 and R5, which are the resistance values due to the leakage current, appear as if these values are increased about 100 times while the value of R4, which is the resistance value due to the ON current, is changed very little. In this case, the potential ssl is about 0.07 V. Thus, when the leakage current is low and Vssl does not need to be increased, Vssl can be prevented from being increased more than necessary by using the circuit of FIG. 5. In the circuit configuration described above, depending on the characteristics of the transistors, if the leakage current needs to be reduced, Vssl can be increased so as to reduce the leakage current and, if the leakage current is not critical, Vssl can be set to a value with which the data in the memory cells is not likely to be damaged.

As an example, when a memory in which memory cells of about 64 kbit are integrated is constructed by using the circuit of FIG. 5, the gate width/gate length of the MOS transistors M1, M2 and M3 may be 0.2 μm/10 μm, 480 μm/0.1 μm and 2.2 μm/0.1 μm, respectively. In this case, the transistor size of the driver MOS, the transfer MOS and the load MOS that constitute the memory cell is 0.28 μm/0.1 μm, 0.2 μm/0.1 μm and 0.18 μm/0.1 μm, respectively. As can be seen from this transistor size, the switch for connecting between ssl and ss has the largest size and requires a large area when it is actually laid out on a silicon substrate. FIG. 7 shows an exemplary layout of the circuit of FIG. 5. The circuit of FIG. 7 is an example of a typical SRAM circuit, wherein MA designates a memory array in which the memory cells are arranged in an array-like manner, WDDR designates a circuit for controlling the word line such as a word driver, AMP designates a circuit for controlling the bit line such as a sense amplifier and a write amplifier, CONT designates a control circuit for generating signals to control the operation of the SRAM circuit, SLSW designates a layout of the switch M2 for connecting between ssl and ss, and re1 designates a signal for controlling M2. Because it can be thought that the signal re1 for controlling M2 is typically generated from the circuit CONT for generating the control signals, the operational speed can be increased by disposing SLSW and CONT at positions adjacent to each other. Though SLSW is disposed between MA and AMP in FIG. 7, SLSW may be disposed between MA and WDDR in some memory constructions. Further, SLSW may be divided into two parts and each part may be disposed between MA and AMP and between MA and WDDR in some constructions.

Figure 8:
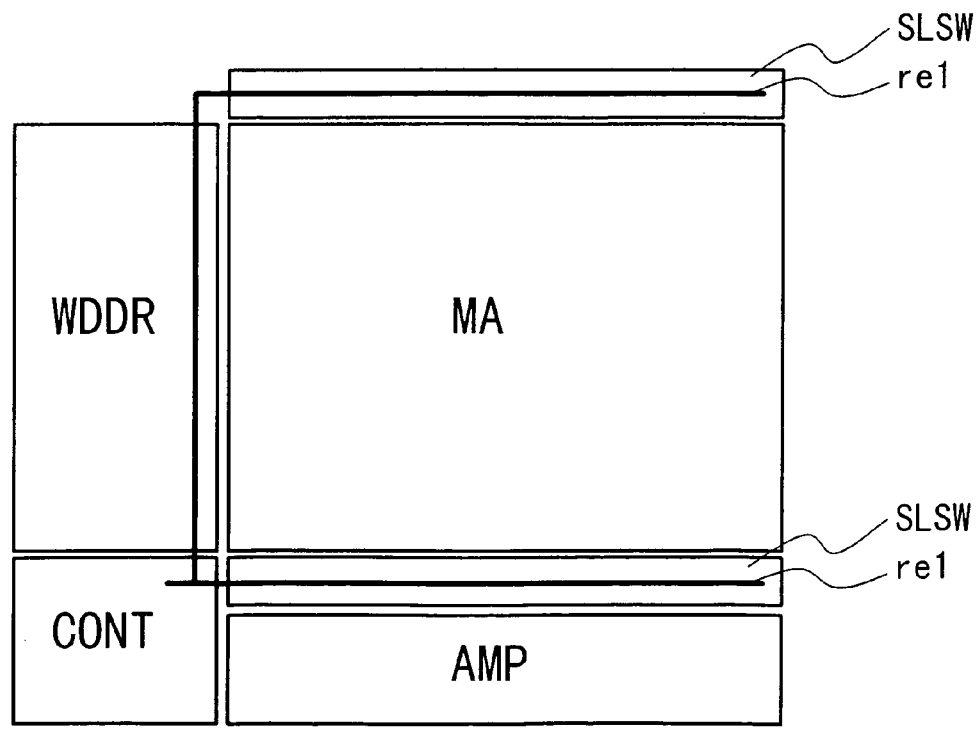
FIG. 8 is a diagram showing a layout of the power supply switch and its control signal in the SRAM circuit.

FIG. 8 shows another exemplary layout of the circuit of FIG. 5. The circuit of FIG. 8 is an example of a typical SRAM circuit, wherein MA designates a memory array in which the memory cells are arranged in an array-like manner, WDDR designates a circuit for controlling the word line such as a word driver, AMP designates a circuit for controlling the bit line such as a sense amplifier and a write amplifier, CONT designates a control circuit for generating signals to control the operation of the SRAM circuit, SLSW designates a layout of the switch M2 for connecting between ssl and ss, and re1 designates a signal for controlling M2. FIG. 8 differs from FIG. 7 in that SLSW is divided into two parts and disposed above and below the memory array. Typically, ssl has a large capacitance including a parasitic capacitance in wiring of ssl and a junction capacitance held by the driver MOS in the memory cells. Further, because the wiring of ssl also acts as a resistance, it takes time for the potential of ssl to be reduced from a value higher than the ground potential to the ground potential. Therefore, in the construction of FIG. 7, it takes time for the ssl of the memory cell that is disposed at the top of the memory array or at the farthest position from the switch to be reduced to the ground potential. On the other hand, in the construction of FIG. 8, because an electric charge accumulated in ssl is discharged from the top and bottom of the memory array, a timing differential to discharge ssl in the memory array is not likely to occur and, therefore, an operational timing of the memory can be designed easily. Though the switches SLSW are disposed above and below the memory array MA in FIG. 8, the switch SLSW may be disposed on the right and left of MA in some constructions. Further, the switch may be divided into four parts and disposed at the top and bottom and on the right and left of MA. Still further, the switch SLSW may be divided into multiple parts to be embedded in the memory array at regular spacings.

In modern SRAM, cells that are called as dummy cells are disposed at the end of the memory array. Each of the dummy cells has a construction substantially similar to the typical memory cell. In the microfabrication process used for manufacturing LSI at present, when a pattern of transistors is made, its geometry may be changed under the influence of the adjacent patterns. If the dummy cells are not used, the geometry of the memory cells at the end of the array may differ from the ones at the center of the array and, therefore, the performance of the memory cells may vary depending on where they are disposed. In this case, if the dummy cells are used, even the memory cell at the end of the memory array has a geometry as well as a performance that is same as the one at the center of the memory array under the influence of the dummy cells disposed at the outside of such memory cell. The dummy cells are used only for making the geometry of the memory cells uniform and are not used for circuit operation. Therefore, by using the dummy cell, the switch M2 as shown in FIG. 5 can be made in the circuit without increasing the surface area.

Figure 9:
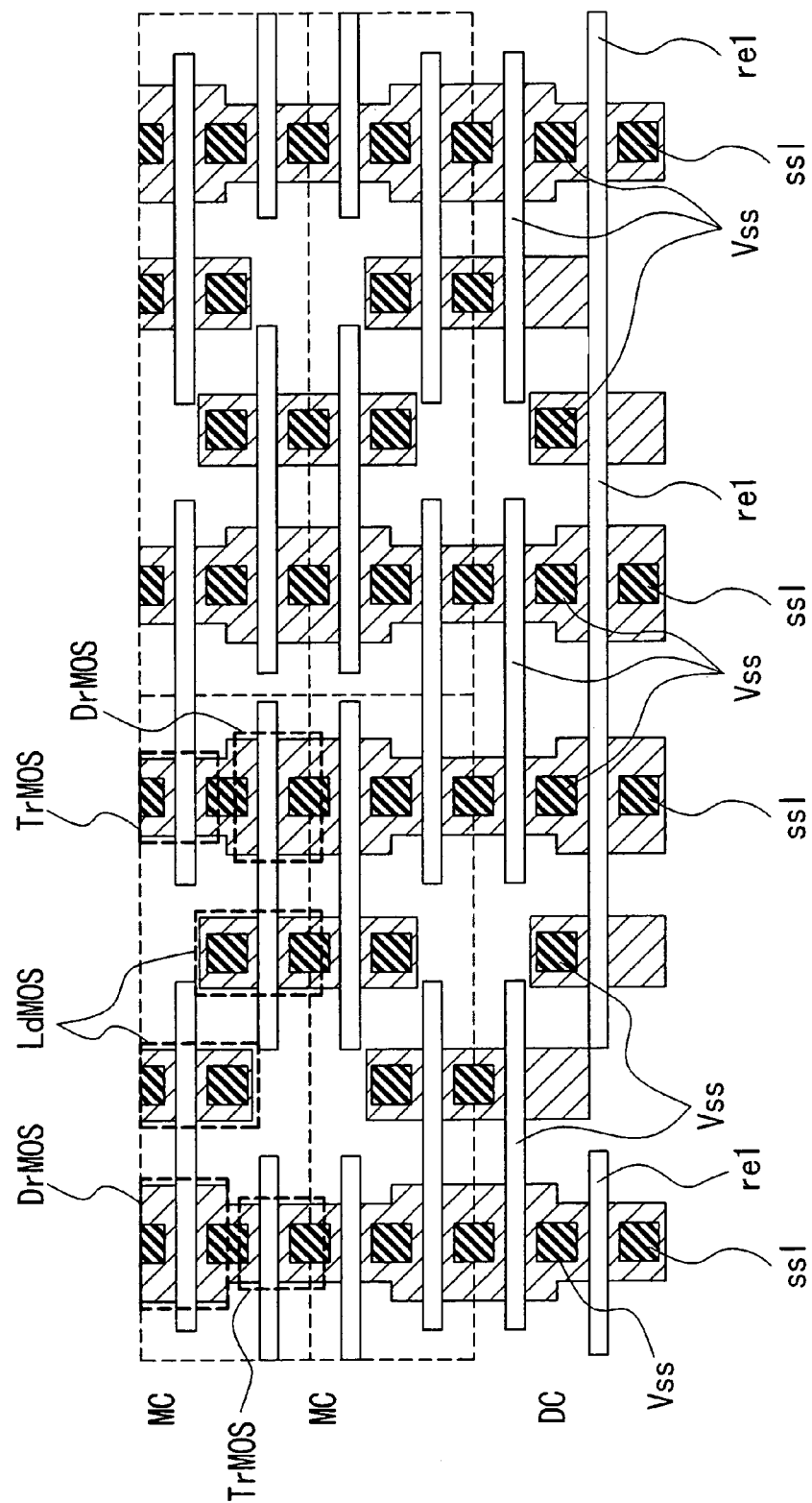
FIG. 9 is a diagram showing a layout of the memory cells, dummy memory cells at the end of a memory array and the power supply switch.

FIG. 9 shows a layout diagram of the end of memory cell array when the switch M2 as shown in FIG. 5 is made by using the dummy cell. In this figure, diagonally shaded areas by narrow lines denote a diffusion layer, diagonally shaded square areas by bold lines denote contacts of the diffusion layer, and rectangular areas extending transversely denote gate polysilicons. Further, each area MC encircled by narrow broken lines denote one memory cell, which is comprised of 6 MOS transistors that are, in turn, encircled by respective bold broken lines. Among the transistors constituting the memory cell, TrMOS designates the transfer MOS in which the drain is connected to the bit line, the gate is connected to the word line, the source is connected to the storage node for holding data in the memory cell, and the back-gate is connected to the p well. DrMOS designates the driver MOS in which the drain is connected to the storage node for holding data in the memory cell, the gate is connected to the other storage node for holding data in the memory cell, to which the drain is not connected, the source is connected to ssl, and the back-gate is connected to the p well. LdMOS designates the load MOS in which the drain is connected to the storage node for holding data in the memory cell, the gate is connected to the other storage node for holding data in the memory cell, to which the drain is not connected, the source is connected to the supply Vdd, and the back-gate is connected to the n-well. DC designates the dummy cell. In this figure, Vss designates nodes that are set to the ground potential, which are connected to gate polysilicons of the non-activated MOS transistors in the dummy cell and to the nodes ssl of the switch M2 shown in FIG. 5. re1 designates nodes corresponding to the signal re1 for controlling the switch M2 in FIG. 5. The switch M2 in FIG. 5 is constituted by the MOS transistors in the dummy cell, which correspond to the driver MOS and the transfer MOS and the gate electrodes of which are set to re1. The source lines of the driver MOS in the memory cells in the memory cell array are connected to the nodes ssl.

Figures 10, 12:
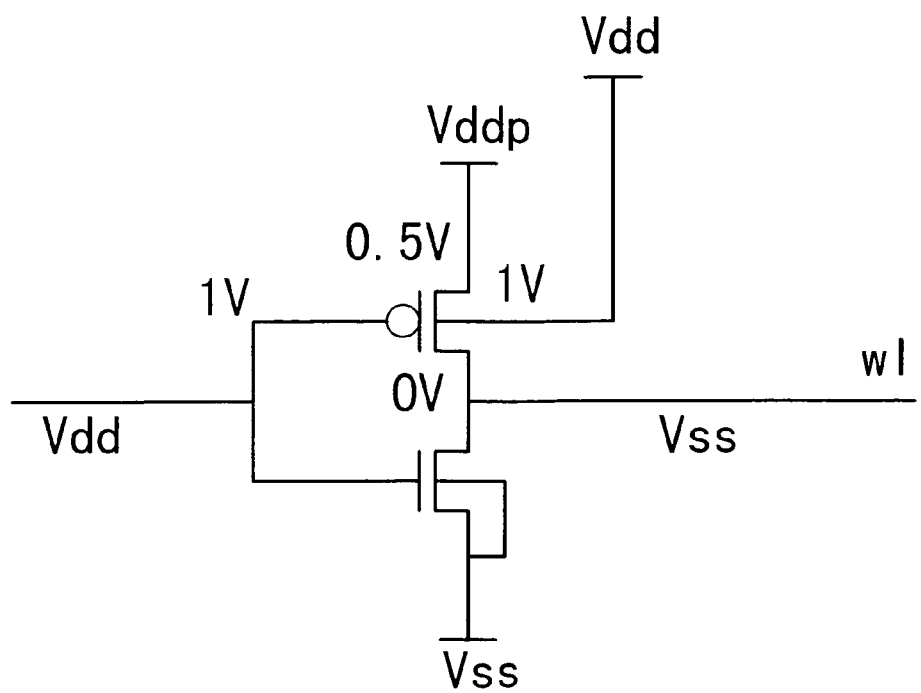
FIG. 10 is a diagram showing a relationship between threshold voltages of transistors in the memory cells as well as transistors used in a logic circuit provided along with memories.
FIG. 12 is a circuit diagram of a word driver.

FIG. 10 shows a relationship between threshold voltages of the transistors constituting the memory cell. At the same time, it shows a relationship between threshold voltages of the transistors for constructing a logic circuit when logic circuits and SRAM circuits are packaged together as in system LSI. A column lvt/hvt shows Vth of the logic circuit, wherein it is assumed that two types of Vth can be used in the process and, therefore, lvt represents the lower Vth and hvt represents the higher Vth. In case 1, all transistors in the SRAM memory cell have the same Vth as the higher one of the two types of transistors used in the logic circuit. This is a configuration that is typically used at present in which the leakage current of the nMOS transistors in the memory cell can be reduced significantly by controlling the potential of ssl. The leakage current of the pMOS transistors can be reduced in proportion to the potential of ssl. This configuration is typically used when the leakage current of the pMOS transistors does not need to be reduced further. If the leakage current of the pMOS transistors needs to be reduced, in addition to controlling ssl, another means for reducing the leakage current must be used. In case 2, the load MOS in the transistors of case 1 have Vth that exceeds the higher one of the two types of transistors used in the logic circuit. The leakage current of the nMOS transistors in the SRAM memory cell is reduced by controlling Vssl while the leakage current of the pMOS transistors is reduced by using the MOS transistors having high Vth. In this configuration, the leakage current can be reduced significantly but, the MOS having high Vth are needed for the load MOS and, therefore, the cost of manufacturing will be increased in comparison with case 1. In case 3, in addition to the load MOS, the driver MOS also have Vth that exceeds the higher one of the two types of transistors used in the logic circuit. The leakage current of the transfer MOS in the SRAM memory cell is reduced by controlling Vssl, the leakage current of the driver MOS is reduced by controlling Vssl and increasing Vth, and the leakage current of the pMOS transistors is reduced by using the MOS transistors having high Vth. The control of Vssl for reducing the leakage current is less effective in the driver MOS than in the transfer MOS and, therefore, it is supplemented by increasing Vth. In this configuration, the leakage current can be reduced more significantly than case 2 but, the MOS having high Vth are needed for the driver MOS and the load MOS and, therefore, the cost of manufacturing will be increased in comparison with case 2. In case 4, the transfer MOS have the same Vth as the lower one of the transistors used in the logic circuit, the driver MOS have the same Vth as the higher one of the transistors used in the logic circuit, and the load MOS have Vth that is higher than the Vth of the transistors used in the logic circuit. Because the driving power of the transfer MOS affects the overall operating speed of the SRAM, the lower the Vth of the transfer MOS is, the higher the speed of the SRAM circuit is. The leakage current of the transfer MOS can be reduced significantly by controlling Vssl in comparison with the other transistors and, therefore, the leakage current is not increased significantly in comparison with case 2. Thus, this is a combination having a high speed and a low leakage current.

Figure 11:
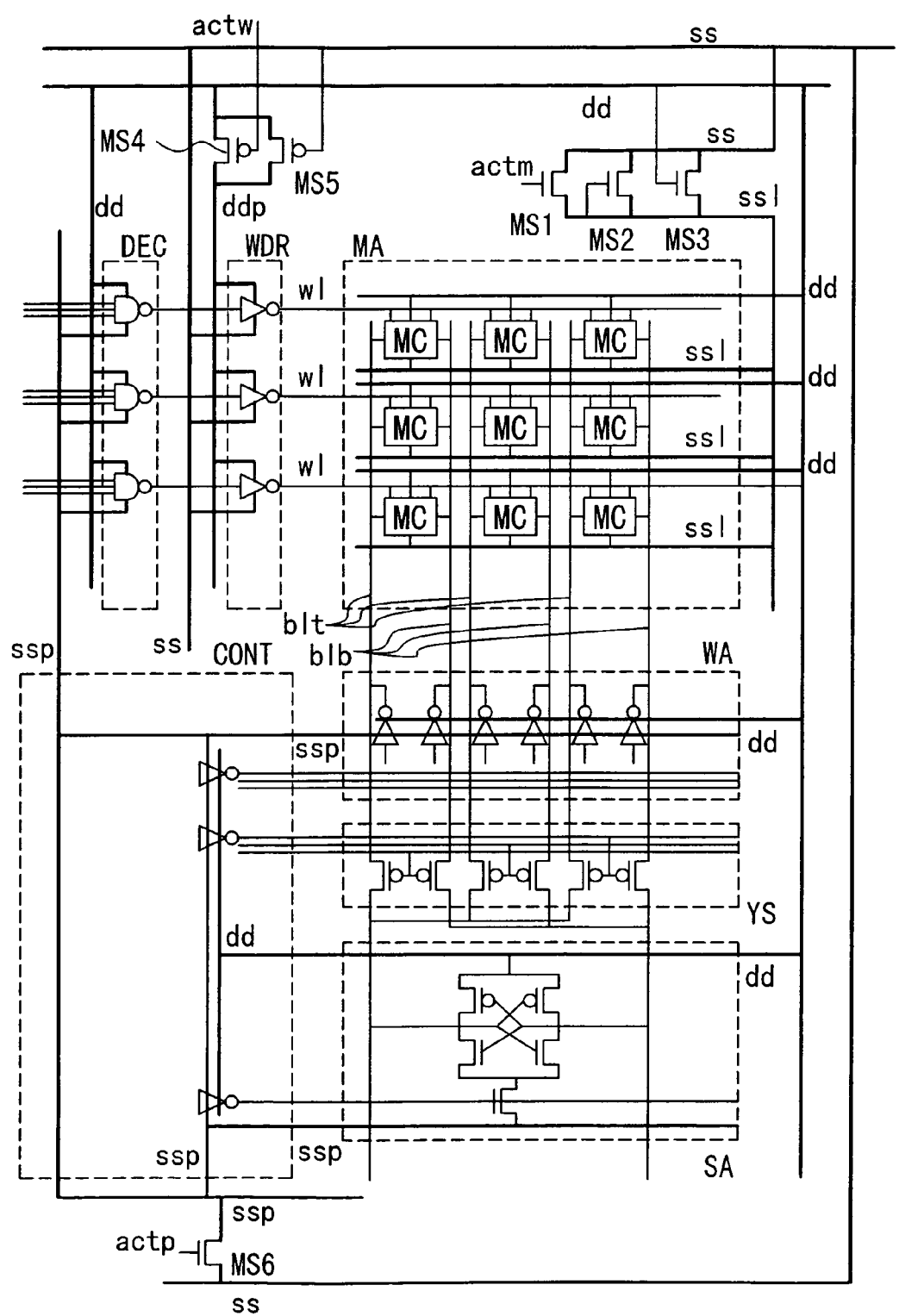
FIG. 11 is a schematic view of a circuit configuration and a power supply configuration of the memory cell array as well as a peripheral circuit for accessing the memory cells to which the present invention is applied.

FIG. 11 schematically shows an example of a power supply configuration as well as a peripheral circuit for the SRAM. There are shown SRAM memory cells MC, a memory array MA in which the memory cells are arranged in an array-like manner, a word driver WDR, a decoder DEC, a precharge circuit and write amplifier WA, a column decoder and Y switch YS, a sense amplifier SA, a control circuit CONT for the SRAM circuit, bit lines blt and blb, word lines wl, supply potential lines dd, ground potential lines ss, source lines ssl for the driver MOS in the memory cells, supply potential lines ddp for the word driver, ground potential lines ssp for the peripheral circuit of the SRAM except the word driver, switch MOS transistors MS1-MS6 for controlling potentials of the supply lines ssl, ddp and ssp, a signal actm for controlling the switch MS1, a signal actw for controlling the switch MS4, and a signal actp for controlling the switch MS6. Here, in FIG. 11, the word driver WDR, the decoder DEC, the precharge circuit and write amplifier WA, the column decoder and Y switch YS, the sense amplifier SA, and the control circuit CONT for the SRAM circuit are collectively referred to as an accessing circuit. MS1, MS2 and MS3 act as SW1, M1 and R1 in FIG. 1, respectively, wherein the potential of ssl is controlled so as to reduce the leakage current of the memory cells by setting MS1 to the OFF state by means of actm in the standby state. MS4 and MS5 control the supply potential lines ddp for the word driver so as to reduce the leakage current of the word driver in the standby state.

With reference to FIG. 12, a method for reducing the leakage current of the word driver by controlling ddp will be described. In FIG. 12, Vdd designates a potential of dd or a supply voltage, Vddp designates a potential of ddp, Vss designates a potential of ss or a ground potential, and wl designates the word line. In the standby state, the supply voltage Vdd is input to the word driver and it turns the nMOS transistor in the word driver ON so that the ground potential Vss is output and the word line is set to Vss or 0V. It allows the memory cell not to be accessed. In this state, because the pMOS transistor in the word driver is turned OFF and the subthreshold current flowing through this transistor acts as the leakage current, this current must be reduced. For example, a power supply setting when the supply voltage is 1.0 V and Vddp is reduced to about 0.5 V is shown in FIG. 12. In this case, the gate potential is 1.0 V, the source potential is 0.5 V, the drain potential is 0 V and the back-gate potential is 1.0 V. Therefore, in the pMOS transistor, a potential between source and drain is 0.5 V, a substrate bias of 0.5 V is applied and a potential of 0.5 V is applied between gate and source and, therefore, the leakage current can be reduced significantly to about 1/10,000 in comparison with the case in which the source potential is 1.0 V. In the circuit of FIG. 11, by using two pMOS transistors MS4 and MS5, the potential of ddp can be reduced to about 0.5 V in the standby state. MS4 is turned OFF by means of actw in the standby state. MS5 is a pMOS transistor that is always in the ON state and outputs a current continuously, wherein the current approximately corresponds to the potential of ddp of 0.5 V in the standby state. Here, the potential of ddp in the standby state is set to about 0.5 V. It is because of the fact that the reduction of the leakage current of the word driver to about 1/10,000 can be considered sufficient to reduce the overall leakage current and, in this case, as the potential of ddp is increased, the time period required to return from the standby state to the active state can be shortened. Therefore, if the leakage current needs to be reduced further, the potential ddp may be reduced to a potential that is close to Vss by using only MS4 as the switch MOS.

In FIG. 11, MS6 is a switch MOS for controlling the potential of supply lines ssp at the side of the ground potential of the SRAM peripheral circuit except the word driver so as to reduce the leakage current of the peripheral circuit in the standby state. In the standby state, the MS6 is turned OFF by means of the control signal actp so that the potential of ssp substantially approximates to the supply potential Vdd so as to reduce the leakage current of the peripheral circuit. In the peripheral circuit except the word driver, the leakage current of both nMOS and pMOS transistors must be reduced and, even if only the potential of ssp is set to about 0.5 V as in the case when the leakage current of the word driver is reduced, the leakage current of the pMOS transistor is not reduced. Therefore, the potential of ssp must be increased to the value close to Vdd in the standby state.

Figure 13:
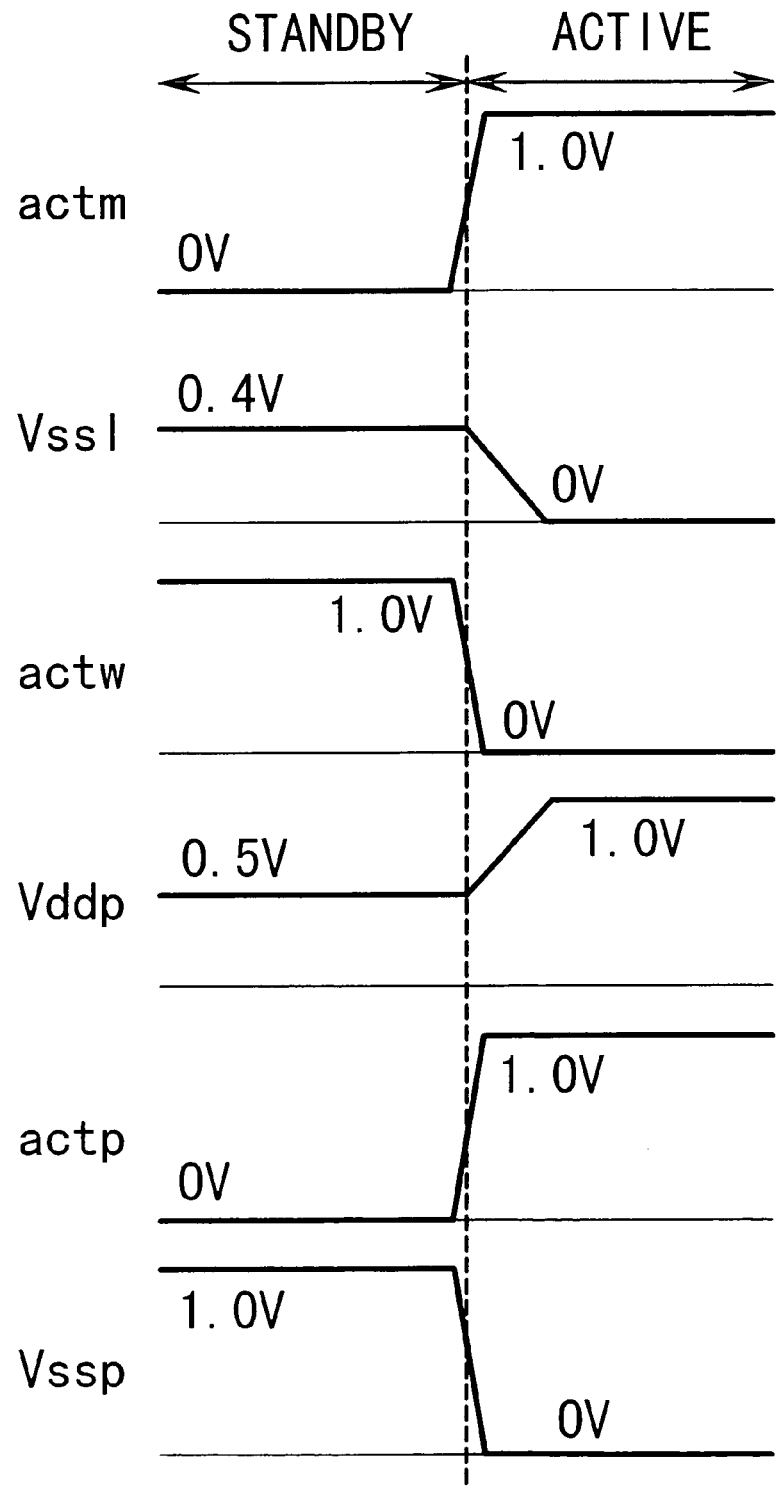
FIG. 13 is a diagram showing potentials at the power supply in the circuit of FIG. 11 and its control signal.

FIG. 13 shows a relationship between the control signals and the potentials of each supply line in the standby and active states. In this figure, "standby" denotes the standby state and "active" denotes the active state. Vssl, Vddp and Vssp represent the potentials of ssl, ddp and ssp, respectively. In the standby state, the signals actm, actw and actp are set to low, high and low, respectively, and the switch MOS MS1, MS4 and MS6 in FIG. 11 are turned OFF. It allows the potentials of ssl, ddp and ssp to be set to about 0.4 V, 0.5 V and 1.0 V, respectively, so as to reduce the leakage current of each circuit. In the operational state of the circuit, the signals actm, actw and actp are set to high, low and high, respectively, and the switch MOS MS1, MS4 and MS6 in FIG. 11 is turned ON. It allows the potentials of ssl, ddp and ssp to be fixed to 0 V, 1.0 V and 0 V, respectively, so that each circuit is in the operational state.

Second Embodiment

Figure 14:
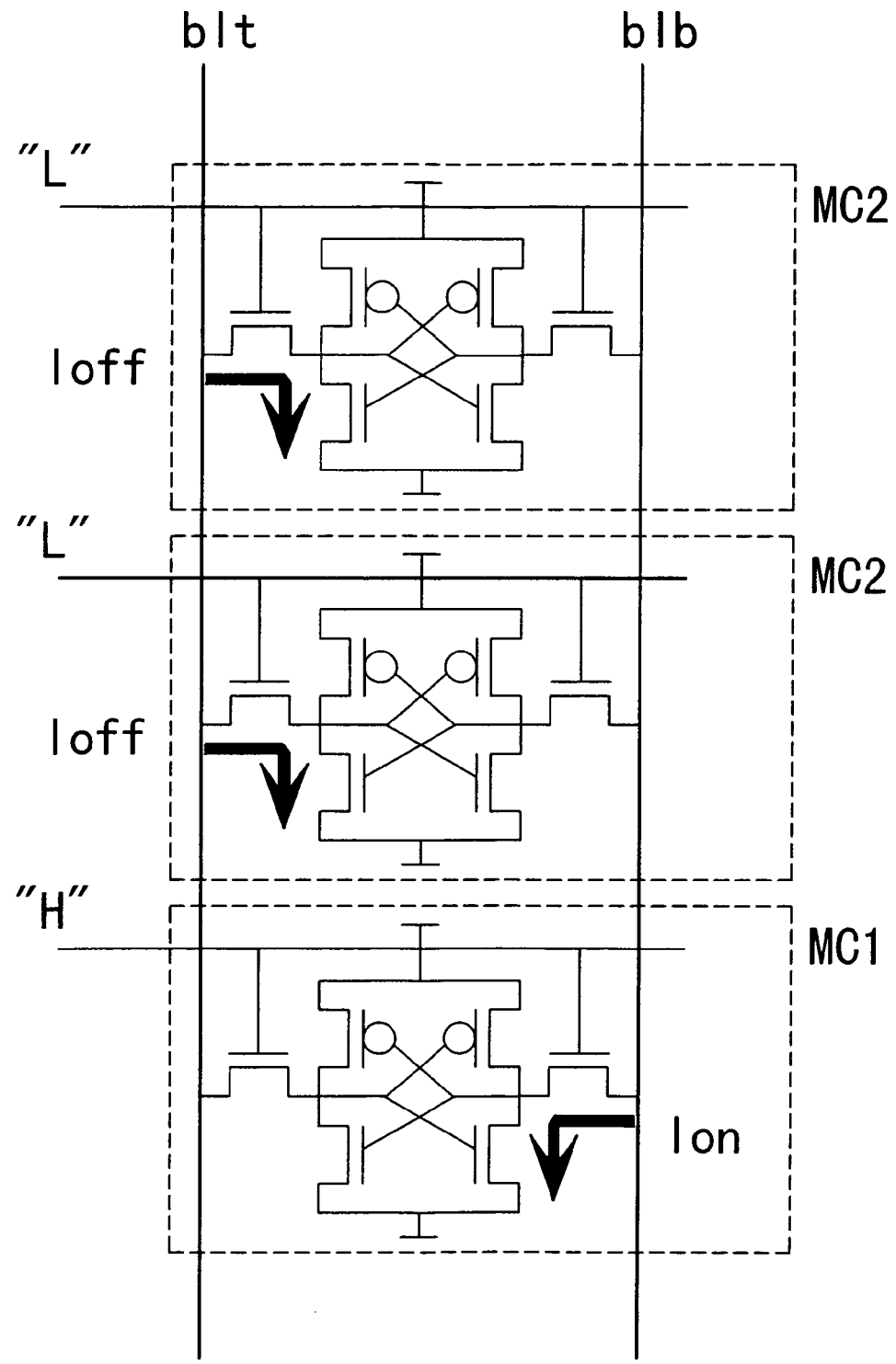
FIG. 14 is a diagram schematically showing a current flowing from a bit line when the data is read from the memory cells.

In order to operate an SRAM circuit at a low voltage, Vth of constituent MOS transistors must be reduced. In particular, because driving power of transfer MOS greatly affects operational speed of the SRAM, the operational speed will be reduced significantly unless Vth of the transfer MOS is reduced as the supply voltage is reduced. For example, in the condition of case 4 shown in FIG. 10, Vth of the transfer MOS is lower than Vth of other MOS transistors. FIG. 14 shows a state when data is read from the memory cell. In FIG. 14, MC1 is a memory cell from which the data is read out and MC2 are other memory cells that are not accessed and store data opposite to MC1 in this example. Ion designates a memory cell current flowing from the transfer MOS of the accessed memory cell and Ioff designates a leakage current flowing through the transfer MOS of the memory cells that are not accessed. When the data is read out, the potential of the bit line blb is reduced to the supply voltage by means of Ion and, at the same time, the potential of the opposite bit line blt is also reduced by means of Ioff and, then, when the potential difference reaches or exceeds a given value, the sense amplifier is activated and the data is read out. In this case, if Ioff is increased, it takes longer time for the potential difference to reach the given value and the readout timing is delayed. Further, if Ioff is increased, at worst, the potential of the bit line blt becomes lower than the potential of the bit line blb and the data cannot be read out normally. Here, when Vth of the transfer MOS is reduced so as to operate the circuit at a low voltage, Ioff in FIG. 14 will be increased and there will be problems in that the readout timing is delayed or the data cannot be read out normally. Therefore, the leakage of the transfer MOS current can be reduced by setting the word line potential of the memory cells that are not accessed to a value lower than the ground potential or less than 0 V. However, in this case, because a power supply circuit such as a charge pump for generating the voltage lower than 0 V is needed, the standby power is increased because of the power consumption of the power supply circuit in the standby state. Here, the method for controlling ssl shown in FIG. 1 is used in combination so that the word line potential of the memory cells that are accessed is set to a negative value in the operational state and the potential of ssl is increased in the standby state. In particular, if the potential of ssl is increased, the leakage current of the transfer MOS can be reduced significantly and, therefore, the leakage current of the transfer MOS having low Vth can be inhibited even when the potential of the word line is not negative. Because it allows the leakage current to be reduced even when the low potential of the word line is set to 0 V, the circuit can be configured so that the power supply circuit such as the charge pump for generating the negative potential is not operated in the standby state so as to reduce the electric power consumption. As described above, by configuring the circuit so that Vth of the transfer MOS is reduced, the low potential of the word line is set to a negative value in the operational state and the potential of the word line is set to 0V so as to increase the potential of ssl, the SRAM circuit that operates at a high speed in the operational speed and consumes low electric power in the standby state can be implemented.

Figure 15:
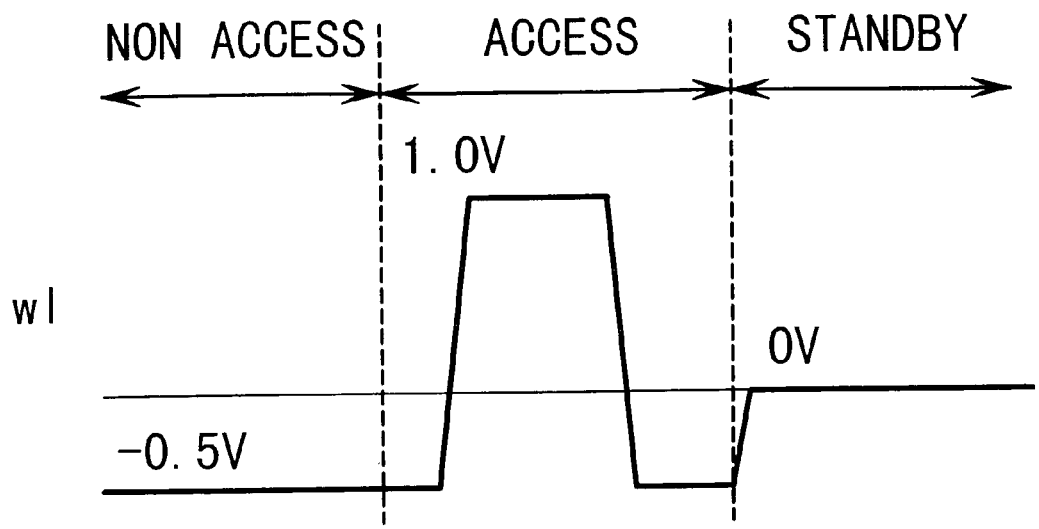
FIG. 15 is a diagram showing a variation of the potential of the word line.

FIG. 15 shows a variation of the potential of the word line of an SRAM having a supply voltage of 1.0 V. "non access" denotes that a memory cell is not accessed, "access" denotes that the memory cell is accessed and "standby" denotes the standby state. When the memory cell is not accessed, the potential of the word line is set to a negative value and the leakage current is inhibited. When the memory cell is accessed, the potential of the word line is increased to the value equal to the supply voltage and the memory cell can be accessed normally. In the standby state, by setting the potential of the word line to 0 V, the need for activating the circuit for generating the negative potential is eliminated so as to reduce the electric power consumption.

Figure 16:
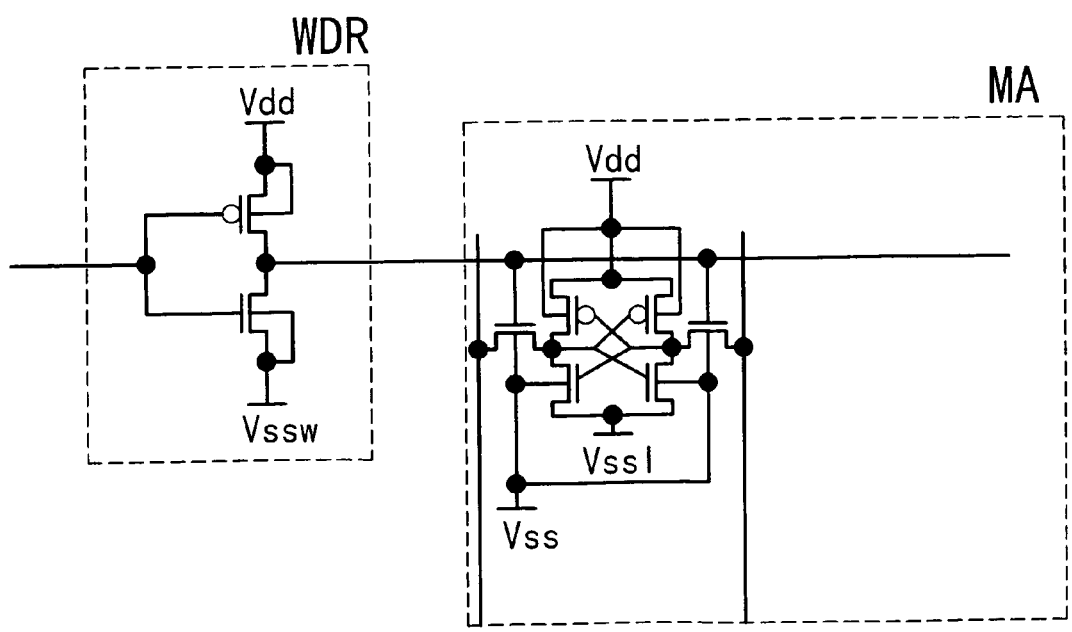
FIG. 16 is a diagram showing a circuit configuration of the word driver and the memory cells.
Figure 17:
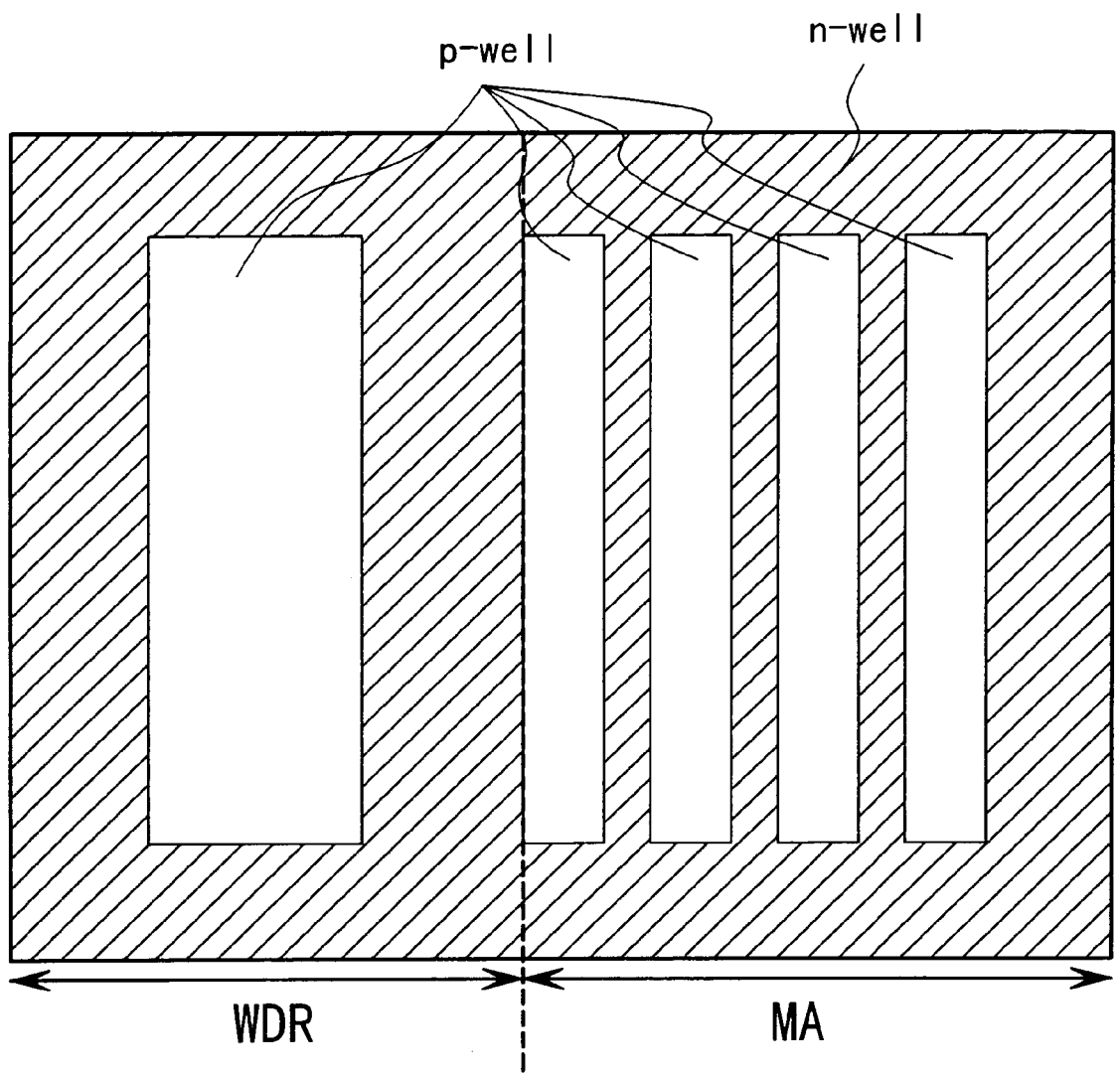
FIG. 17 is a diagram showing a construction of wells of the word driver and the memory cells.

FIG. 16 shows a circuit configuration when the word line potential of the memory cell that is not accessed is reduced to a negative value. In FIG. 16, there are shown a word driver WDDR and a memory cell array MA, wherein Vdd designates a supply potential, Vssl designates a source line potential of the driver MOS in the memory cell, Vss designates a ground potential and Vssw designates a word line potential when it is reduced to a negative value. The substrate potential of the nMOS transistors in the memory cell is set to Vss, which is indispensable for controlling Vssl so as to reduce the leakage current. The substrate potential of the nMOS transistor in the word driver is set to the negative potential Vssw. It is because there are some problems in that, if the substrate potential of the nMOS in the word driver is set to Vss, a forward bias voltage is applied to the nMOS in the word driver so that a current flows through the PN junction so as to increase the electric power consumption and a latch-up is likely to occur. Therefore, it is indispensable to separate the p-well, which is a substrate terminal of the nMOS in the word driver from the p-wells, which are substrate terminals of the nMOS in the memory cells. FIG. 17 shows a well construction. In FIG. 17, there are shown an area WDDR in which the word driver is disposed, another area MA in which the memory cells are disposed, p-wells and an n-well. It can be seen that the p-well in the word driver is separated from the p-wells in the memory cells. In the triple cell construction that is typically used in system LSI at present, the p-wells can be separated easily and, therefore, this well construction can be optimal. However, when the triple well construction cannot be utilized, it is difficult to separate the p-wells and, therefore, any other method must be applied: for example, the word line may not be set to the negative potential but, on the contrary, the potential of the word line may be set to a value higher than the supply potential when the memory cell is accessed so as to increase the driving power of the transfer MOS.

Third Embodiment

Figure 18:
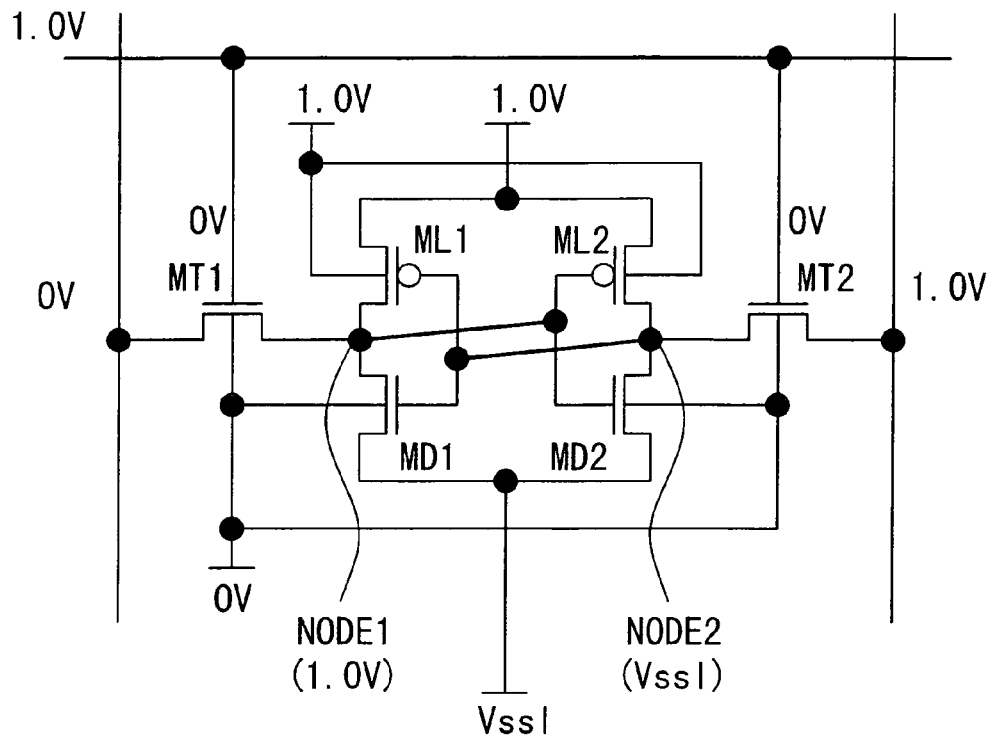
FIG. 18 is a diagram showing potentials of each node in the memory cell at the time of writing.
Figure 19:
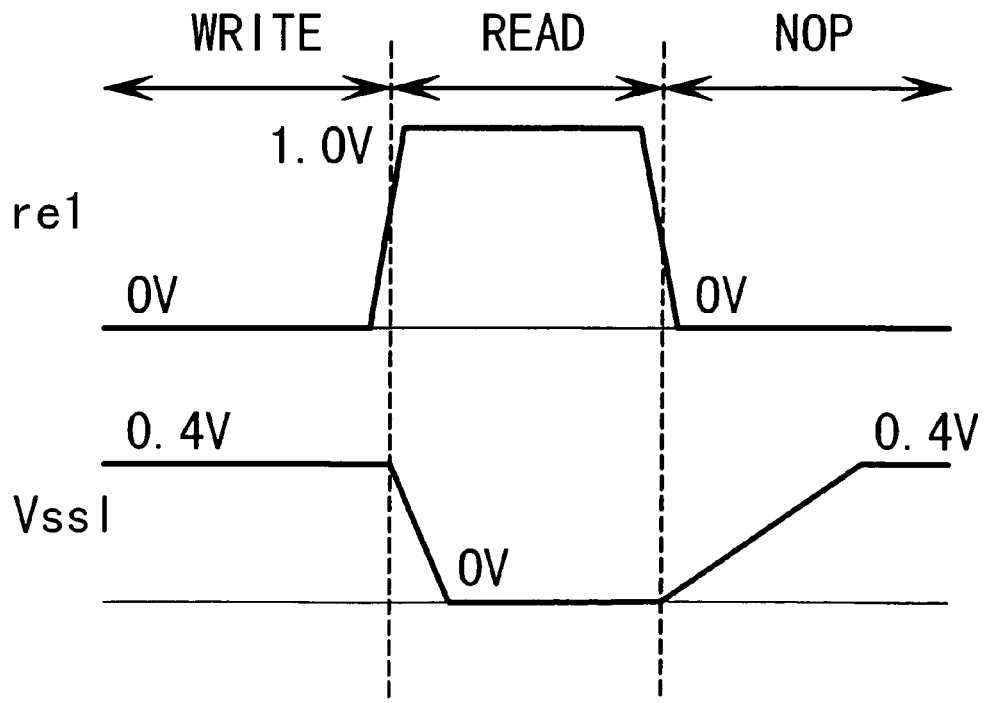
FIG. 19 is a diagram showing a condition of potentials of the supply line ssl and its control signal in a third embodiment.

FIG. 18 shows potentials of each node when inverted data of the data stored in the SRAM memory cell is written. node1 and node 2 are storage nodes, wherein the potential of each node before the data is written is shown in parentheses. When the data is written, the charge of the storage node node1 is discharged through the transfer MOS transistor MT1 and, at the same time, the charge is loaded into the node1 from the load MOS transistor ML1. Because the writing of the data is finished by discharging the charge of the node1, when the driving power of the transfer MOS is large and the driving power of the load MOS is small, the data will be written at a high speed. Here, when the potential of Vssl is set to 0.4 V, which is same as in the standby state in the first embodiment, the voltage between gate and source of ML1 is reduced and the driving power of the load MOS is reduced so that the writing operation will be accelerated. Thus, an SRAM circuit that can write data at a high speed can be implemented by configuring the memory array as shown in FIG. 1, setting Vssl to 0.4 V when the data is written and in the standby state and to 0 V when the data is read out. Here, when the SRAM is not in the standby state but is not accessed, it is desirable to set the Vss1 to 0.4 V so that the leakage current of the inactive memory can be inhibited. FIG. 19 shows the control voltages. In FIG. 19, "write" designates a writing cycle, "read" designates a reading cycle, and "nop" designates a cycle in which the memory is not accessed.

Figure 20:
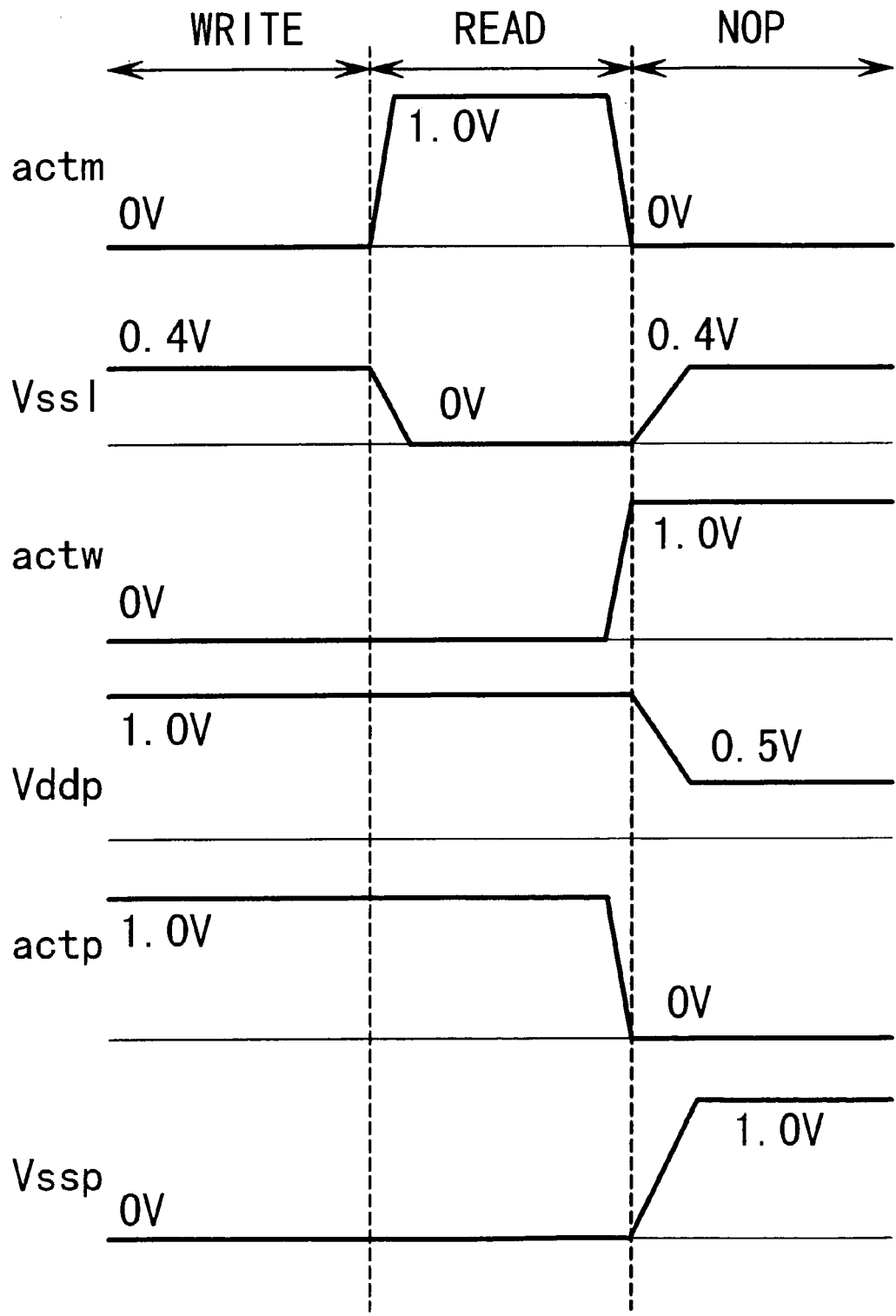
FIG. 20 is a diagram showing a condition of potentials of the supply lines and their control signals in the third embodiment.

FIG. 20 shows control signals and supply potentials when the value of Vssl is increased when the data is written by using the SRAM circuit of FIG. 11. In FIG. 20, "write" designates a writing cycle, "read" designates a reading cycle, and "nop" designates a cycle in which the memory is not accessed. When the control of FIG. 20 is performed, the leakage current of the memory array part of the SRAM flows only when the data is read out and the leakage current of the peripheral circuit flows when the memory cell is accessed. Therefore, by dividing the SRAM memory into several mats and controlling accesses to each mat independently, the leakage current of the SRAM memory circuit in the operating cycle can be reduced significantly. For example, when the memory is divided into 8 mats and the mats that are not accessed are set to the nop state shown in FIG. 20, the leakage current of the SRAM circuit in the operational state can be reduced to 1/8.

Fourth Embodiment

Figure 21:
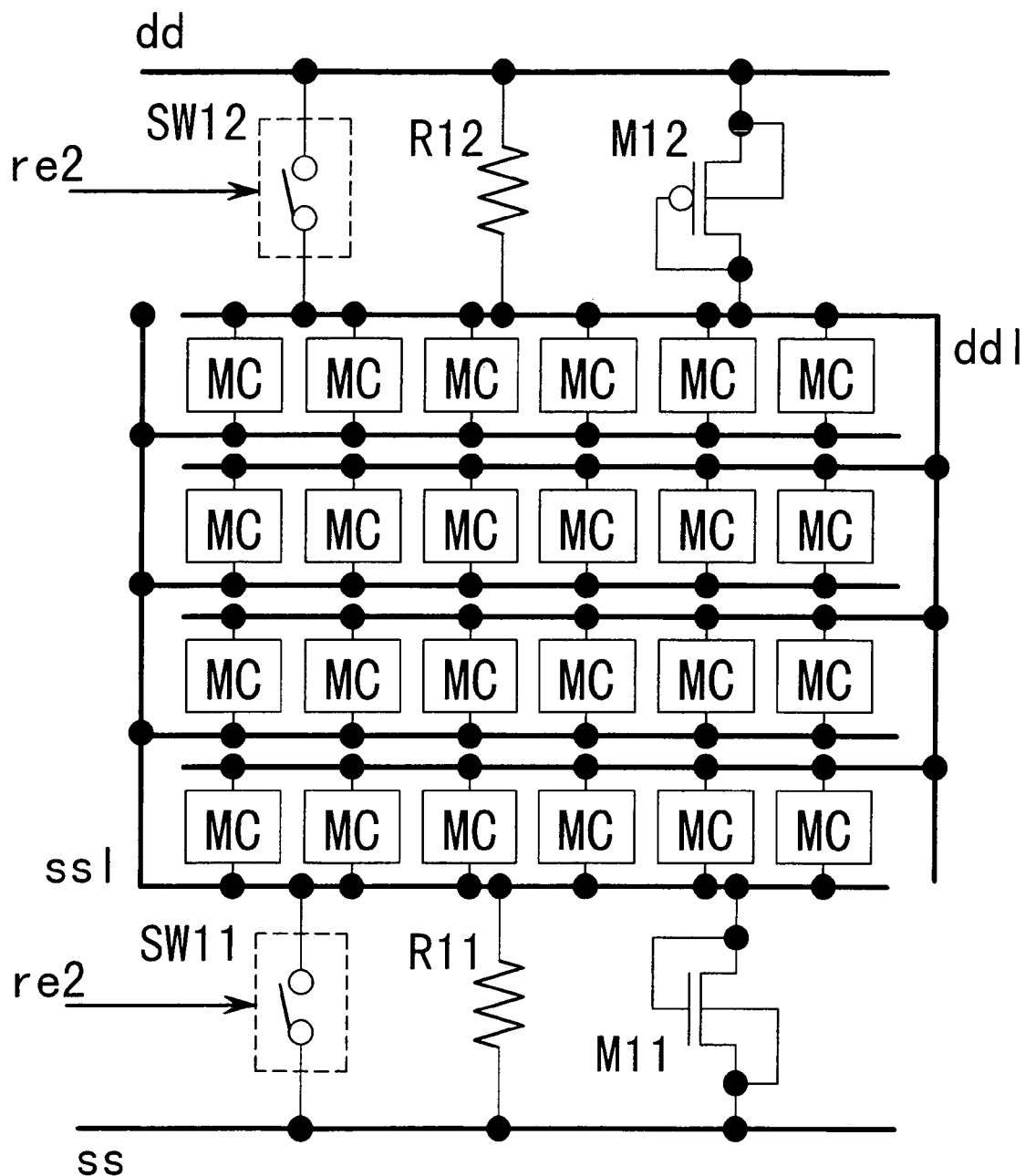
FIG. 21 is a schematic view of a circuit configuration and a power supply configuration of an SRAM circuit in a fourth embodiment.

FIG. 21 schematically shows an SRAM circuit to which the present invention is applied. In FIG. 21, there are shown SRAM memory cells MC, a source line ssl for driver MOS in the memory cells, a ground potential line ss, a source line ddl for load MOS in the memory cells, a supply potential line dd, switch circuits SW11 and SW12 that are turned ON or OFF by a control signal re2, resistances R11 and R12, an nMOS transistor M11 connected as a diode between ssl and ss, and a PMOS transistor M12 connected as a diode between ddl and dd. The construction of the MC in FIG. 21 differs from the one in FIG. 2 in that dd in FIG. 2 is replaced by ddl. In FIG. 21, when the SRAM circuit is operating, by closing the switches SW1 and SW2, the potentials of ssl and ddl are set to the ground potential and supply potential, respectively, which are similar to the ones in typical SRAM. When the SRAM circuit is not operating and the data is stored, the switches SW11 and SW12 are opened by the control signal re2. At this time, the potential of ssl is determined by the relationship among the leakage current of the memory cells, the current flowing through the resistance R11 and the current of the MOS transistor M11 connected as a diode. The potential of ddl is determined by the relationship among the leakage current of the memory cells, the current flowing through the resistance R12 and the current of the MOS transistor M12 connected as a diode. Further, if the switches SW11 and SW12 is constituted by MOS or other devices having a leakage current even in the OFF state, in addition to the currents of the above devices, the OFF currents of the switches SW11 and SW12 affect the potentials of ssl and ddl. Assuming that the potential of ssl is Vssl and the potential of ddl is Vddl, if Vddl−Vssl is higher than the voltage at which the memory cells can retain the data, the data can be retained while reducing the leakage current. In this example, because the substrate bias effect is applied to the load MOS in the memory cells, the leakage current of the load MOS, which cannot be reduced sufficiently in the circuit of FIG. 1, can also be reduced significantly.

According to the present invention, the leakage current of the SRAM circuit can be reduced significantly. Further, the SRAM circuit can operate at a high speed.

What is claimed is:

1. A semiconductor integrated circuit device comprising:
   first and second bit lines;
   a memory array including a plurality of memory cells each of the plurality of memory cells having a first driver MOSFET having a source coupled to a first node, a drain coupled to a second node, and a gate coupled to a third node, a first load MOSFET having a source coupled to a fourth node, a drain coupled to the second node, and a gate coupled to the third node, a second driver MOSFET having a source coupled to the first node, a drain coupled to the third node, and
   a gate coupled to the second node, a second load MOSFET having a source coupled to the fourth node, a drain coupled to the third node, and a gate coupled to the second node, a first transfer MOSFET having a source/drain path coupled between the first bit line and the second node, and a second transfer MOSFET having a source/drain path coupled between the second bit line and the third node;
   first switch MOSFETs having a source coupled to a first voltage and a drain coupled to the sources of the first and second driver MOSFETS of the plurality of memory cells and a gate coupled to a control signal;
   a first area in which the first driver MOSFETs and the first transfer MOSFETs are formed in a column and the second driver MOSFETs and the second transfer MOSFETs are formed in the column; and
   a second area, in which the first switch MOSFETs are formed, and which is adjacent to the first area,
   diffusion layers including the source or the drain of said first and second driver MOSFETs, said first and second transfer MOSFETs and said first switch MOSFET, and gates including gates of said first and second driver MOSFETs, said first and second transfer MOSFETs and said first switch MOSFET that are alternately formed and are continuously formed through the first and second areas,
   wherein each of the first driver MOSFETs, the first transfer MOSFETs, the second driver MOSFETs, and the second transfer MOSFETs is composed of the diffusion layers formed in the first area and the gates formed in the first area, and
   wherein each of the first switch MOSFETs is made up of the diffusion layers formed in the second area and the gate formed in the second area 2. A semiconductor integrated circuit device according to claim 1,
   wherein the plurality of first MOSFETs are formed in a direction parallel to the first and second bit lines.

3. A semiconductor integrated circuit device according to claim 1,
   wherein the first driver MOSFETs and the first transfer MOSFETs are alternately formed adjacent one another.

4. A semiconductor integrated circuit device according to claim 1,
   wherein the gate provided between the gates of the plurality of first driver and transfer MOSFETs and the gate of the first switch MOSFET is supplied with a ground potential.

5. A semiconductor integrated circuit device according to claim 2,
   wherein the first switch MOSFETs are set to an OFF status in a standby state, and
   wherein the first MOSFETs are set to an ON status in an active state.

* * * * *

UNITED STATES PATENT AND TRADEMARK OFFICE
CERTIFICATE OF CORRECTION

| | | |
|---|---|---|
| PATENT NO. | : 7,821,814 B2 | Page 1 of 1 |
| APPLICATION NO. | : 12/222753 | |
| DATED | : October 26, 2010 | |
| INVENTOR(S) | : M. Yamaoka et al. | |

It is certified that error appears in the above-identified patent and that said Letters Patent is hereby corrected as shown below:

ON THE TITLE PAGE

Correct item (73) Assignee: to read as follows:

(73) Assignee: ~~Renensas~~ <u>Renesas</u> Electronics Corporation, Kanagawa (JP).

Signed and Sealed this
First Day of February, 2011

David J. Kappos
*Director of the United States Patent and Trademark Office*